US012166346B1

United States Patent
Qi et al.

(10) Patent No.: US 12,166,346 B1
(45) Date of Patent: Dec. 10, 2024

(54) FULLY DISTRIBUTED ISLAND MICRO-GRID ATTACK ELASTICITY CONTROL SYSTEM AND METHOD

(71) Applicants: Zhejiang University, Hangzhou (CN); Hainan Research Institute of Zhejiang University, Sanya (CN)

(72) Inventors: Donglian Qi, Hangzhou (CN); Xueqi Wang, Hangzhou (CN); Yunfeng Yan, Hangzhou (CN); Guangxin Zhi, Sanya (CN); Dawang Fu, Sanya (CN)

(73) Assignees: Zhejiang University, Hangzhou (CN); Hainan Research Institute of Zhejiang University, Sanya (CN)

( * ) Notice: Subject to any disclaimer, the term of this patent is extended or adjusted under 35 U.S.C. 154(b) by 0 days.

(21) Appl. No.: 18/650,125

(22) Filed: Apr. 30, 2024

(30) Foreign Application Priority Data

Jul. 10, 2023 (CN) .......................... 202310844590.5

(51) Int. Cl.
*H02J 3/00* (2006.01)
*G01R 23/04* (2006.01)
(Continued)

(52) U.S. Cl.
CPC .............. *H02J 3/001* (2020.01); *G01R 23/04* (2013.01); *G01R 31/086* (2013.01); *H02J 3/004* (2020.01); *H02J 3/388* (2020.01); *H02J 2203/20* (2020.01)

(58) Field of Classification Search
CPC .. H02J 3/001; H02J 3/004; H02J 3/388; H02J 2203/20; G01R 23/04; G01R 31/086
See application file for complete search history.

(56) References Cited

U.S. PATENT DOCUMENTS

| 2018/0048154 A1 | 2/2018 | Guo et al. |
| 2022/0342435 A1* | 10/2022 | Qi .............................. H02J 3/38 |

FOREIGN PATENT DOCUMENTS

| CN | 113258614 A | 8/2021 |
| CN | 114336674 A | 4/2022 |
| CN | 115276038 A | 11/2022 |

OTHER PUBLICATIONS

Wang Xinsheng, et al., Research on Distributed Cooperative Control Strategy for Microgrid, Electric Drive, 2016, pp. 66-69, vol. 46 No.5.

(Continued)

*Primary Examiner* — Charles R Kasenge
(74) *Attorney, Agent, or Firm* — Bayramoglu Law Offices LLC

(57) ABSTRACT

A fully distributed island micro-grid attack elasticity control system and method are provided. The method includes following specific steps: collecting basic information of a local AC micro-grid bus of a distributed power generation unit and basic information of a neighbor distributed power generation unit connected through a directed communication topology; predicting, based on a dynamic equation of the distributed power generation unit, a sequence of states thereof within a set period of time, namely, the predicted sequence of states; judging whether a system is under attack according to a comparison result of the predicted sequence of states and a real-time state sampling value of a micro-grid, to obtain a sequence of optimal auxiliary control inputs $u_i^*$; and calculating an optimal angular frequency reference value $\omega_i^*$ at the next time point according to the sequence of optimal auxiliary control inputs $u_i^*$.

9 Claims, 6 Drawing Sheets

(51) Int. Cl.
*G01R 31/08* (2020.01)
*H02J 3/38* (2006.01)

(56) References Cited

OTHER PUBLICATIONS

Li Zhonglei, et al., A coordinate control strategy of islanded microgrid based on bus agent, Transactions of China Electrotechnical Society, 2015, pp. 370-376, vol. 30 No. 1.

* cited by examiner

FULLY DISTRIBUTED ISLAND MICRO-GRID ATTACK ELASTICITY CONTROL SYSTEM AND METHOD

CROSS-REFERENCE TO THE RELATED APPLICATIONS

This application is based upon and claims priority to Chinese Patent Application No. 202310844590.5, filed on Jul. 10, 2023, the entire contents of which are incorporated herein by reference.

TECHNICAL FIELD

The present invention relates to the technical field of micro-grid secondary control, and more specifically to a fully distributed island micro-grid attack elasticity control system and method.

BACKGROUND

With an increase in the penetration rate of distributed new energy resources, the requirements for intelligent development are put forward for new generation power systems. A micro-grid can effectively integrate a distributed power supply and a local load, and improve system stability and economy; and the micro-grid, as a controlled unit of the large power grid, effectively weakens the adverse effects caused by the connection of new energy resources into the grid. When the micro-grid is connected to the grid, the dynamic characteristics thereof are mainly determined by a main grid. When a power grid has failure, the micro-grid will quickly switch to an island mode for operation, namely forming an island micro-grid. Due to the loss of the support of power grid voltage and frequency, the micro-grid must be autonomously controlled by a control system to achieve voltage and frequency synchronization.

A hierarchical control architecture is widely used for an island micro-grid to ensure a safe and stable operation of a system. A droop control is usually used for the first layer of control to achieve equalization of an active power and a reactive power of a distributed power supply. The second layer of control is used for frequency and voltage correction in a primary control. A more flexible distributed control strategy is used in order to adapt to the plug-and-play new energy resources, and it is required to exchange electrical information such as frequency and voltage between distributed power supplies by a communication network. A distributed control island micro-grid with high integration of a physical system and a communication network is a typical cyber-physical system exposed to and threaten by extreme man-made attacks such as network attacks.

Network attacks can cause a control algorithm to fail to achieve a control target at the least, or cause the micro-grid to collapse at the worst, thereby leading to serious economic losses and unpredictable consequences. Therefore, how to improve the island micro-grid attack elasticity is an urgent problem to be solved by those skilled in the art.

SUMMARY

In view of this, the present invention provides a fully distributed island micro-grid attack elasticity control system and method, and solves the above-mentioned problems.

To achieve the above-mentioned objective, the present invention provides the following technical solutions:

a fully distributed island micro-grid attack elasticity control method, comprising the following specific steps:

Step 1: collecting basic information of a local alternating current (AC) micro-grid bus of a distributed power generation unit and basic information of a neighbor distributed power generation unit connected through a directed communication topology;

Step 2: predicting, based on a dynamic equation of the distributed power generation unit, a sequence of states thereof within a set period of time, namely the predicted sequence of states; and storing the predicted sequence of states;

Step 3: judging whether a system is under attack according to a comparison result of a state value of the predicted sequence of states and a real-time state sampling value of a micro-grid, and obtaining a sequence of optimal auxiliary control inputs $u_i^*$ according to a judgment result;

Step 4: using the first item of the sequence of optimal auxiliary control inputs $u_i^*$ as an auxiliary control input to calculate an optimal angular frequency reference value $\omega_i^*$ at the next time point; and Step 5: inputting the optimal angular frequency reference value $\omega_i^*$ and an optimal potential reference value $E_i^*$ into a droop controller in a real-time manner to complete correction of a primary control of the droop controller.

Optionally, the step of obtaining the predicted sequence of states comprises:

constructing a discrete-time dynamic equation of the distributed power generation unit considering attack elasticity;

constructing a nominal dynamic equation based on the discrete-time dynamic equation of the distributed power generation unit considering attack elasticity; and predicting the sequence of states thereof within the set period of time according to the nominal dynamic equation.

Optionally, an expression of the discrete-time dynamic equation of the distributed power generation unit considering attack elasticity is:

$$x_i(k+1)=Ax_i(k)+B[u_i(k)+\delta_1(x_i(k),u_i(k))]+\delta_2(x_i(k));$$

i $Dw_i = B\delta_1 + \delta_2$;

in the expression, $x_i(k)$ is a state of an attack elasticity controller of the i-th DG at the time point k; $x_i(k+1)$ is a state of the attack elasticity controller of the i-th DG at the time point k+1; $u_i(k)$ is an auxiliary control input of the attack elasticity controller of the i-th DG at the time point k; $\delta_1(x_i,u_i)$ is a bounded attack on an auxiliary control input actuator of the i-th DG; $\delta_2(x_i)$ is the bounded attack on an auxiliary control measurement device of the i-th DG; $w_i$ is the sum of the bounded attacks on the i-th DG; and A, B, C and D are controller system matrices.

Optionally, the nominal dynamic equation is defined as follows:

$$z_i(k+1)=Az_i(k)+Bv_i(k).$$

in the equation, $z_i(k)$ is a nominal system state of the attack elasticity controller of the i-th DG at the time point k; $z_i(k+1)$ is a nominal system state of the attack elasticity controller of the i-th DG at the time point k+1; and A and B are both controller system matrices.

Optionally, an expression for an error between an actual state value and a nominal state value is:

$$e_i(k) = x_i(k) - z_i(k);$$

-continued
$$e_i(k+1) = x_i(k+1) - z_i(k+1)$$
$$= Ae_i(k) - BKe_i(k) + Dw_i(k);$$
$$= (A - BK)e_i(k) + Dw_i(k)$$

in the expression, $x_i(k)$ is the state of the attack elasticity controller of the i-th DG at the time point k; $z_i(k)$ is the nominal system state of the attack elasticity controller of the i-th DG at the time point k; $x_i(k+1)$ is the state of the attack elasticity controller of the i-th DG at the time point k+1; $z_i(k+1)$ is the nominal system state of the attack elasticity controller of the i-th DG at the time point k+1; K is a system linear feedback gain of the attack elasticity controller of the i-th DG, which is required to meet |eig(A−BK)|<1; $e_i(k)$ is an error between the real-time state sampling value and the nominal state value of the i-th DG at the time point k; $w_i$ is the sum of the bounded attacks on the i-th DG; and A and B are both controller system matrices.

Optionally, the first item of the sequence of optimal auxiliary control is used as the auxiliary control input, and its expression is:

$$u_i^*(k+0) = -Ke_i(k+0) + K_{MPC}^{k+0}(e_i \otimes I) \left\{ \begin{array}{c} a_{ij} \sum_{j \in N_b i} F[\hat{y}_i(k+N) - \hat{y}_j(k+N)] \\ + b_i F_0[y_i(\hat{k}+N|k) - y_{ref}] \end{array} \right\};$$

in the expression, $u_i^*(k+0)$ is the first item of the sequence of optimal auxiliary control; $e_i(k+0)$ is the error between the real-time state sampling value and the nominal state value of the i-th DG at the time point k; $a_{ij}$ is a communication topology connectivity coefficient between the i-th DG and the j-th DG; $b_i$ is a connectivity coefficient between the i-th DG and a leader node; $K_{MPC}^{k+0}$ is a local pre-calculated control coefficient, wherein $K_{MPC}^{k+0} = -r_i R^{-1} B^T (A^T)^{N-1} C^T$; $\hat{y}_i(k+N)$ is an estimated value of a prediction visual field terminal input of the attack elasticity controller of the i-th DG at the time point k; $\hat{y}_j(k+N)$ is the estimated value of the prediction visual field terminal output of the attack elasticity controller of the j-th DG at the time point k; I is an identity matrix of an appropriate dimension; and $y_{ref}$ is an output reference value of a system leader node.

Optionally, in order to achieve global optimization of a micro-grid control system in a distributed manner, any local optimal function is required to meet the following constraint conditions:

$$J_i\left(\sum_{s=0}^{N-1} u_1^*(k+s|k), \ldots, \sum_{s=0}^{N-1} u_i^*(k+s|k), \ldots, \sum_{s=0}^{N-1} u_n^*(k+s|k)\right) \leq$$
$$J_i\left(\sum_{s=0}^{N-1} u_1^*(k+s|k), \ldots, \sum_{s=0}^{N-1} u_i^*(k+s|k), \ldots, \sum_{s=0}^{N-1} u_n^*(k+s|k)\right);$$
$$J_i(k) = \frac{a_{ij}}{2} \sum_{j \in N_b i} \|y_i(k+N|k) - y_j(k+N|k)\|_F^2$$

wherein $$+ \frac{b_i}{2} \|y_i(k+N|k) - y_{ref}\|_{F_0}^2 + \frac{1}{2r_i} \sum_{s=0}^{N-1} \|u_i(k+s|k)\|_R^2;$$

in the expression, $\|\cdot\|$ is an Euclidean norm, $\|\rho\|_F = \rho^T F \rho K_{MPC}^{k+0} = -r_i R^{-1} B^T (A^T)^{N-1} C^T$; F is a clustering error weight matrix; $F_0$ is an output adjustment weight matrix; R is a control cost weight matrix; $y_i(k+N|k)$ is the prediction visual field terminal output of the attack elasticity controller of the i-th DG at the time point k; $a_{ij}$ is the communication topology connectivity coefficient between the i-th DG and the j-th DG; $b_i$ is the connectivity coefficient between the i-th DG and the leader node; $y_j(k+N|k)$ is the prediction visual field terminal output of the attack elasticity controller of the j-th DG at the time point k; $r_i$ is an auxiliary control input coefficient of the j-th DG; $y_{ref}$ is the output reference value of the system leader node; $J_i$ is a local optimization objective function of the i-th DG; S is any visual field range in the sequence, s∈[1,N]; $u_n^*(k+s|k)$ is any item of the sequence of optimal auxiliary control in a prediction visual field range of the n-th DG at the time point k.

Optionally, the step of judging whether the system is under attack comprises:

obtaining the real-time state sampling value at any time point;

comparing the real-time state sampling value at any time point with the state value of the predicted sequence of states at corresponding time point to obtain the solution of a mean square error; and according to a comparison result of the mean square error and a set threshold value, judging whether the system is under attack: if the system is not under attack, using the optimal auxiliary control input calculated by the real-time state sampling value, and if the system is under attack, using the optimal auxiliary control input calculated by the state value of the predicted sequence of states at the corresponding time point.

Optionally, an expression for obtaining the optimal angular frequency reference value $\omega_i^*$ according to the sequence of optimal auxiliary control inputs $u_i^*$ is:

$$\omega_i^* = \int u_i^* + D_{P,i} P_i$$

in the expression, $u_i^*$ is the sequence of optimal auxiliary control inputs of the i-th DG; $\omega_i^*$ is the optimal angular frequency reference value of the i-th DG at the next time point; $D_{P,i}$ is a droop control coefficient of the i-th DG; and $P_i$ is output active power of the i-th DG.

A fully distributed island micro-grid attack elasticity control system consists of an information layer structure and a physical layer, wherein a local control architecture of each distributed power generation unit comprises a communication network, a state collector, an attack elasticity controller, a power controller, a voltage controller, a current controller, a voltage source inverter;

the communication network is used for data transmission between distributed power supplies;

the state collector is used for collecting basic information of a local AC micro-grid bus and basic information of a neighbor distributed power generation unit connected through a directed communication topology; the attack elasticity controller is used for judging whether each distributed power generation unit is subject to an out-of-bounds malicious attack, and calculating a local distributed sequence of optimal auxiliary control inputs $u_i^*$ with attack elasticity, to obtain an optimal angular frequency reference value $\omega_i^*$ and an optimal potential reference value $E_i^*$;

the power controller is used for completing a compensation for a primary control frequency deviation of a droop controller in the power controller according to the optimal angular frequency reference value $\omega_i^*$ and the optimal potential reference value $E_i^*$;

the voltage controller is used for obtaining a reference current $I_{li}^*$ input into the current controller according to a reference voltage $V_{oi}^*$;

the current controller is used for obtaining a reference voltage for controlling a pulse-width modulation (PWM) generator to generate a PWM signal according to the reference current $I_{li}^*$ input into the current controller and an output voltage-current value of the voltage source inverter after dq decomposition; and the voltage source inverter is used for outputting a voltage according to the PWM signal and an angular frequency $\omega_i$ of the power controller.

It can be seen from the above-mentioned technical solutions that compared with the prior art, the present invention discloses a fully distributed island micro-grid attack elasticity control system and method, which can achieve the passive defense against bounded attacks for a local actuator and a measurement device of a distributed power supply in a distributed manner. An attack detection device as a front-end link can enable the system to achieve active defense against more serious attacks. Moreover, by greatly reducing the calculation burden of the controller system during real-time processing, the system is enabled to achieve real-time defense against malicious attacks.

BRIEF DESCRIPTION OF THE DRAWINGS

In order to explain the embodiments of the present invention or the technical solutions in the prior art more clearly, the drawings that need to be used in the description of the embodiments or the prior art will be briefly introduced below. Apparently, the drawings described below are only some of the embodiments of the present invention. Other drawings may further be obtained by those of ordinary skill in the art according to the provided drawings, without exertion of any inventive work.

DETAILED DESCRIPTION OF THE EMBODIMENTS

The technical solutions in the embodiments of the present invention will be clearly and completely described below in combination with the drawings in the embodiments of the present invention. Obviously, the embodiments described are only some of the embodiments of the present invention and not all of the embodiments. Based on the embodiments of the present invention, all other embodiments obtained by those of ordinary skill in the art without any inventive work fall within the scope of protection of the present invention.

Figure 1:
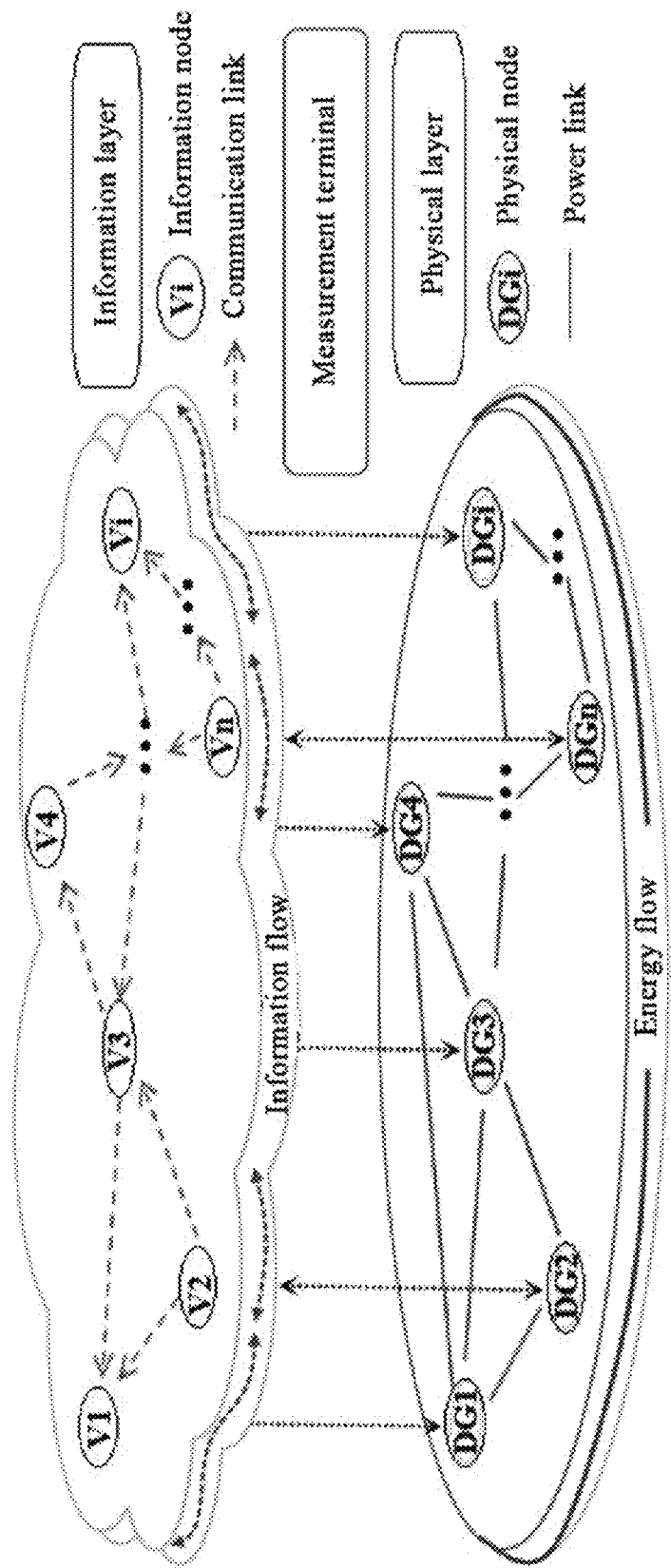
FIG. 1 is a structural schematic diagram of an island micro-grid of the present invention.

An embodiment of the present invention discloses a fully distributed island micro-grid attack elasticity control method, which performs real-time defense against a malicious attack on an island micro-grid. The island micro-grid structurally shown in FIG. 1 consists of an information layer structure and a physical layer, wherein the physical layer comprises n distributed power generation units connected to a micro-grid bus through a voltage source inverter (VSI).

An information layer includes a sparse and efficient directed connection communication topology of a spanning tree. The directed connection topology can be represented by $\mathcal{G}(\mathcal{V},\mathcal{E},\mathcal{A},\mathcal{B})$, wherein $\mathcal{V}=\{v_1, v_2, \ldots, v_s\}$ is a node set; $\mathcal{E}$ is a directed edge set; $\mathcal{N}_i$ represents a neighbor node set, $\mathcal{N}_i=\{v_j|(i,j)\in \mathcal{E}\}$; $\mathcal{A}\in \mathbb{R}^{n\times n}$ is an adjacent matrix of the topology, $\mathcal{A}=[a_{i,j}]$, wherein $a_{i,j}$ has a value of 1 when there is a directed connection, otherwise it is 0; $\mathcal{B}\in \mathbb{R}^n$ is a connection gain matrix, wherein, if a node i can receive information from a leader node, $b_i$ has a value of 1, otherwise it is 0. The sparse and efficient communication network involved in the present embodiment is the directed connection topology including a spanning tree, which meets the conditions for triggering multi-MAS collaborative consensus. A graphic Laplacian matrix of the communication topology is $$\mathcal{L} = \mathrm{diag}\left\{\sum_{j=1}^{n} a_{i,j}\right\} - \mathcal{A},$$

and $\mathcal{G} = \mathrm{diag}\{\mathcal{B}\}$.

Figure 2A:
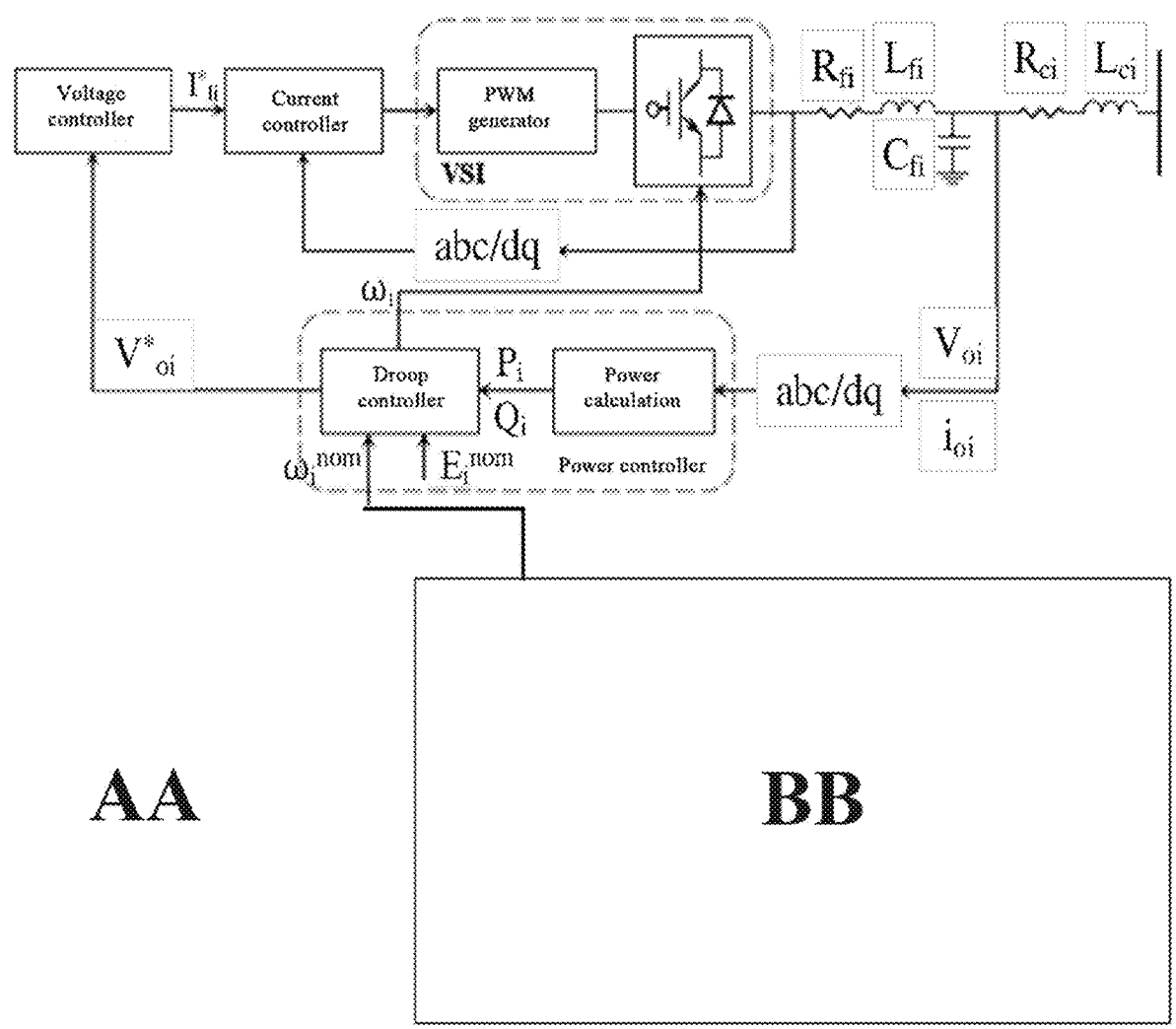
FIG. 2A is a schematic diagram of a local control architecture of a distributed power generation unit of the present invention, where
Figure 2B:
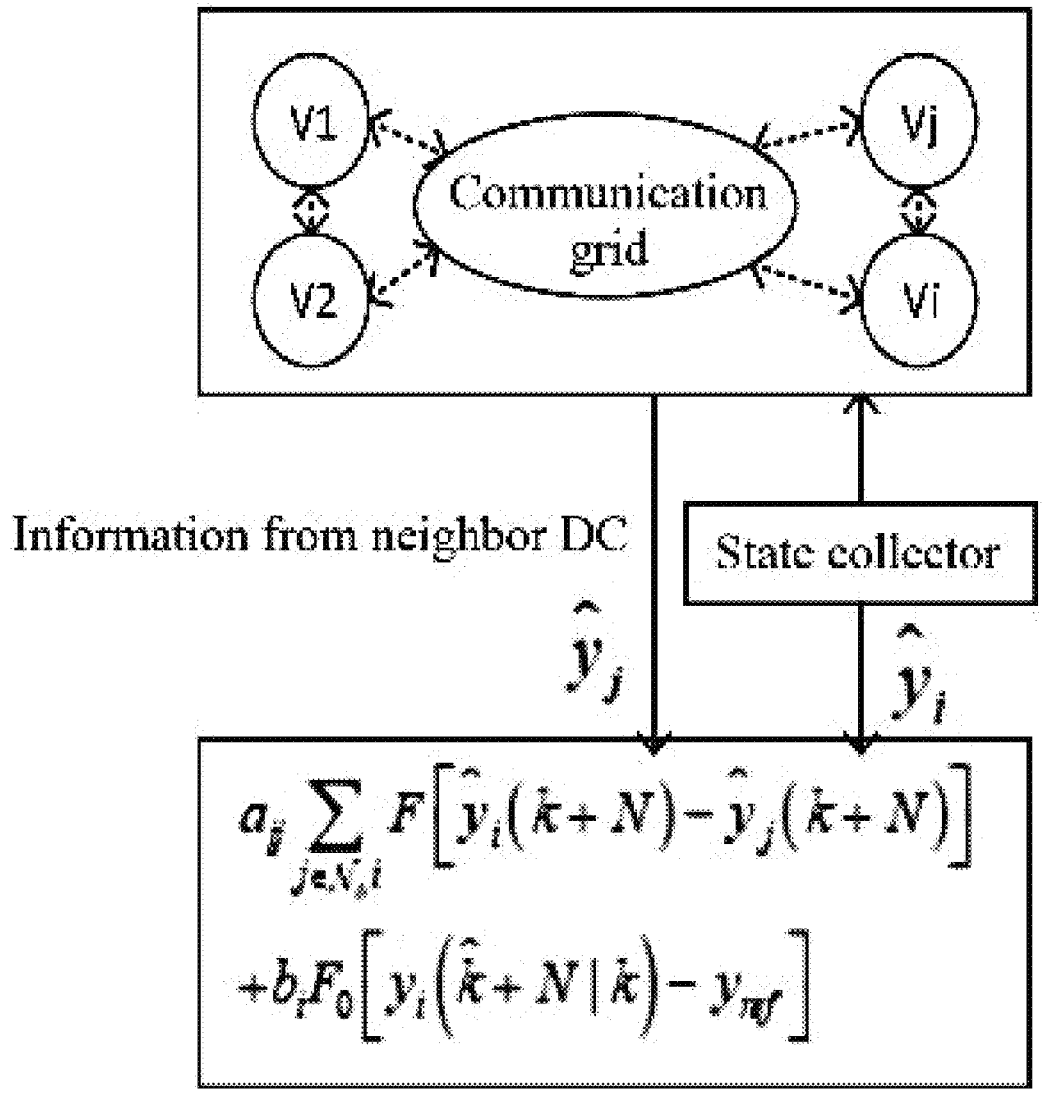
FIG. 2B shows the AA content in FIG. 2A.
Figure 2C:
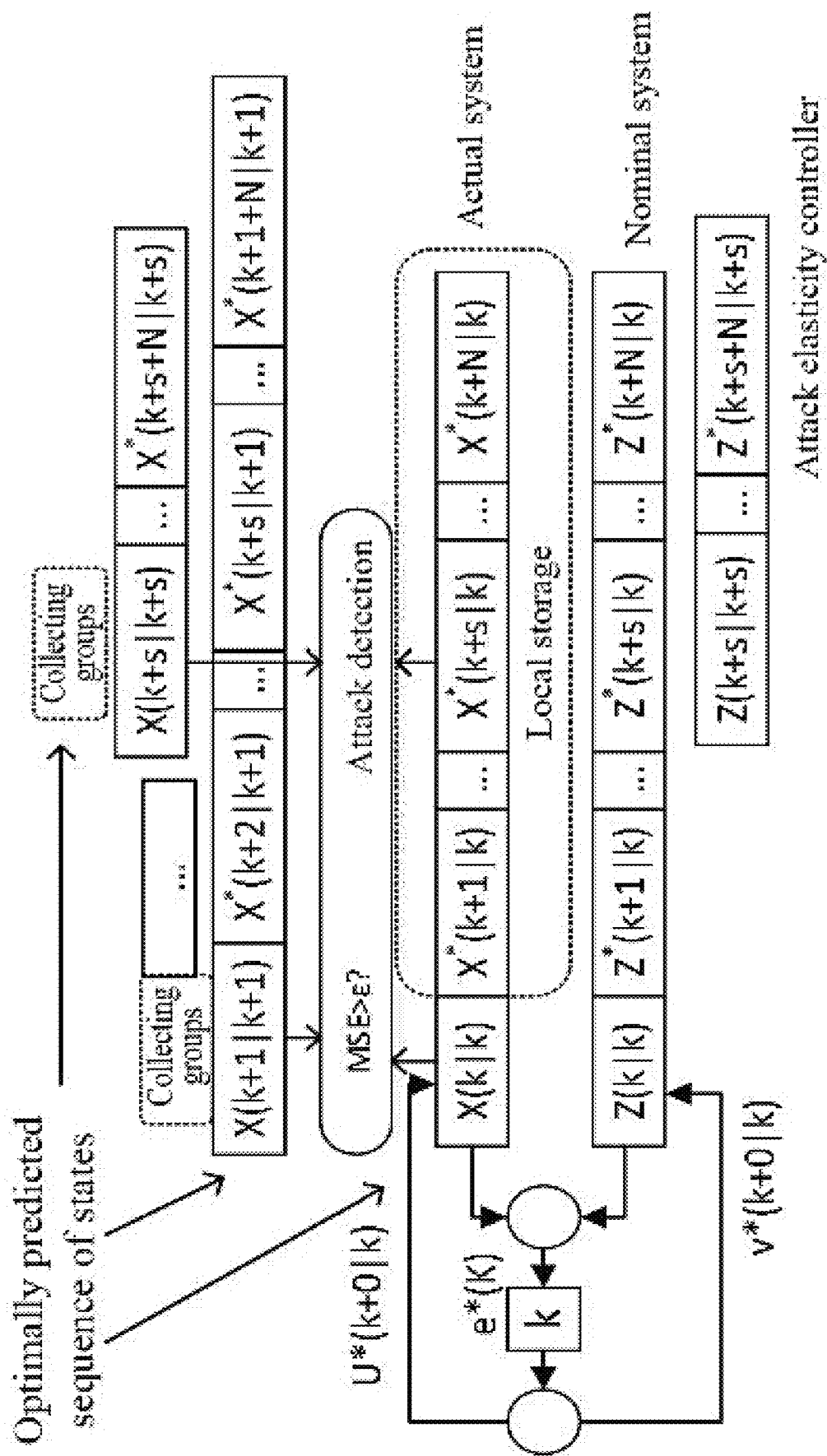
FIG. 2C shows the BB content in FIG. 2A.

As shown in FIGS. 2A-2C, the local control architecture of each distributed power generation unit comprises a communication network, a state collector, an attack elasticity controller, a power controller, a voltage controller, a current controller, and a voltage source inverter, wherein the power controller comprises a power calculation device and a droop controller; three-phase voltage and current information $v_{oi}$, $i_{oi}$ is collected from AC micro-grid bus and subsequently subjected to abc/dq orthogonal decomposition before being input into the power controller; the power calculation device calculates to obtain an active power and a reactive power $P_i$, $Q_i$ of a micro-grid bus terminal according to the input voltage and current information; and a specific expression of the droop controller of the power controller is:

$$\begin{cases} \omega_i = \omega_i^* - D_{P,i}(P_i - P_i^*) \\ E_i = E_i^* - D_{Q,i}(Q_i - Q_i^*) \end{cases}; \quad (1)$$

A reference voltage $V_{oi}^*$ input into the voltage controller and an angular frequency $\omega_i$ input into the voltage source inverter are obtained; the communication network is used for data transmission; the state collector is used for collecting three-phase voltage information $v_{oi}$, three-phase current information $i_{oi}$ and output angular frequency information $\omega_i$ of a local droop controller of a local AC micro-grid bus as well as voltage information $v_{oj}$, current information $i_{oj}$ and angular frequency information $\omega_j$ of an adjacent distributed power generation unit of any distributed power generation unit; the attack elasticity controller is used for judging whether each distributed power generation unit is under an out-of-bounds malicious attack, and being capable of elastically recovering malicious attack with a limited upper bound, as well as calculating a local distributed optimal auxiliary control input with attack elasticity $u_i^*$, thereby inputting a frequency set point $\omega_i^*$ and a voltage set point $E_i^*$ to the power controller; the voltage controller is used for obtaining a reference current $I_{li}^*$ input into the current controller according to the reference voltage $V_{oi}^*$; the current controller is used for obtaining the reference voltage for controlling a PWM generator to generate a PWM signal according to the reference current $I_{li}^*$ input into the current controller and the voltage and current value output by the inverter after dq decomposition; and the voltage source inverter is used for outputting a voltage according to the PWM signal and the angular frequency $\omega_i$ of the power controller.

In another embodiment, a state estimator is further comprised for estimating a state of a neighbor node.

Figure 4:
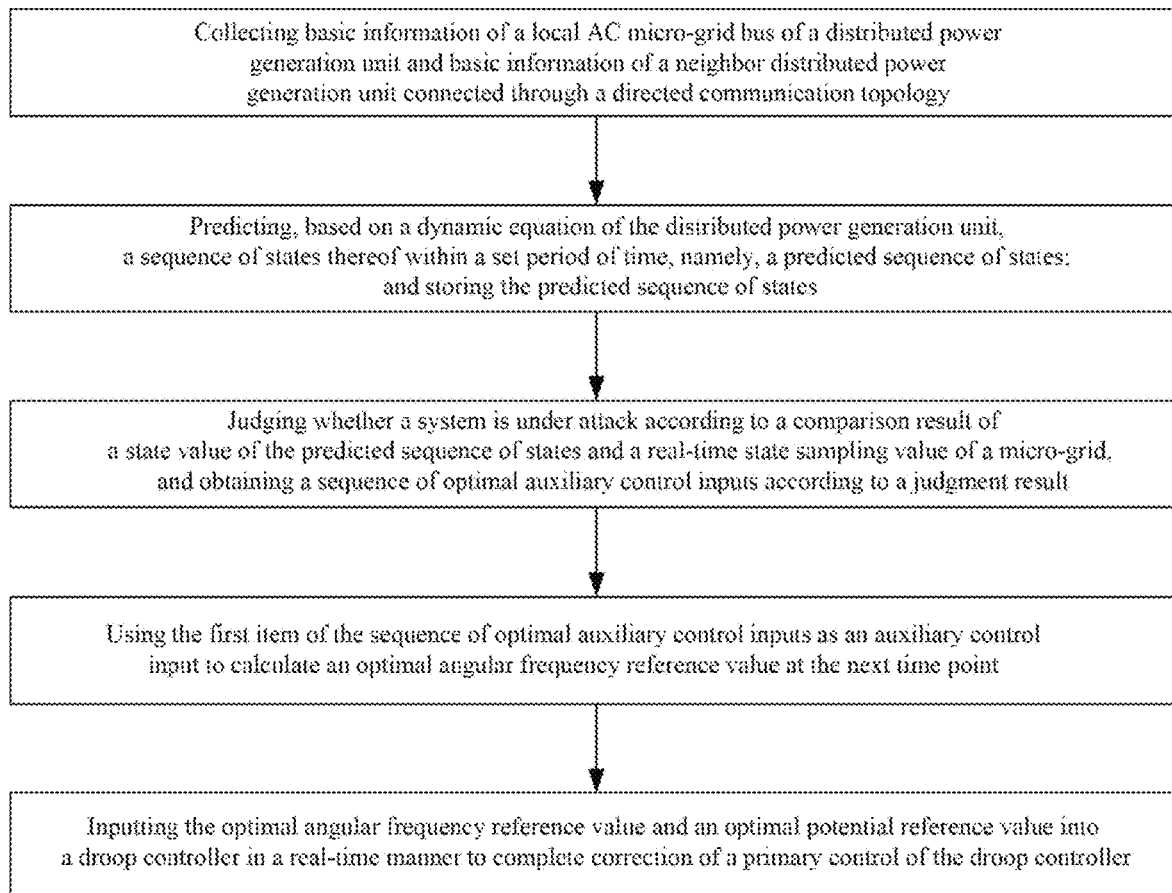
FIG. 4 is a schematic diagram of a flow process of a method of the present invention.

The present embodiment comprises a fully distributed island micro-grid attack elasticity control method, as shown in FIG. 4, comprising the following specific steps:

Step 1: collecting basic information of a local AC micro-grid bus of a distributed power generation unit and basic information of a neighbor distributed power generation unit connected through a directed communication topology;

Step 2: predicting, based on a dynamic equation of the distributed power generation unit, a sequence of states thereof within a set period of time, namely the predicted sequence of states; and storing the predicted sequence of states;

Step 3: judging whether a system is under attack according to a comparison result of a state value of the predicted sequence of states and a real-time state sampling value of a micro-grid, and obtaining a sequence of optimal auxiliary control inputs $u_i^*$ according to a judgment result;

Step 4: using the first item of the sequence of optimal auxiliary control inputs $u_i^*$ as an auxiliary control input to calculate an optimal angular frequency reference value $\omega_i^*$ at the next time point; and Step 5: inputting the optimal angular frequency reference value $\omega_i^*$ and an optimal potential reference value $E_i^*$ into a droop controller in a real-time manner to complete correction of a primary control of the droop controller.

Therein, in Step 1, the basic information of the local AC micro-grid bus collected thereby comprises: three-phase voltage information $v_{oi}$, three-phase current information $i_{oi}$ and output angular frequency information $\omega_i$ of the local droop controller of the local AC micro-grid bus.

The basic information of the adjacent distributed power generation unit comprises voltage information $v_{oj}$, current information $i_{oj}$ and angular frequency information $\omega_j$ of the adjacent distributed power generation unit of the distributed power generation unit.

In Step 2, the step of obtaining the predicted sequence of states comprises:

a discrete-time dynamic equation of the distributed power generation unit considering attack elasticity can be defined as:

$$x_i(k+1)=Ax_i(k)+B[u_i(k)+\delta_1(x_i(k),u_i(k))]+\delta_2(x_i(k)) \quad (2a)$$

$$y_i(k)=Cx_i(k) \quad (2b)$$

wherein $x_i(k+0|k)=x_{ik}$; only at time k, the i-th is known by the distributed power generation unit.

In order to uniformly represent various attacks, set:

$$Dw_i=B\delta_1+\delta_2 \quad (3);$$

Due to uncertain $\omega_i$, its specific dynamics cannot be described. Therefore, a nominal model of the original system is defined to predict a future state of the system, and the nominal dynamic equation is defined as follows:

$$z_i(k+1)=Az_i(k)+Bv_i(k) \quad (4);$$

wherein, $z_i(k+0|k)=x_{ik}$.

in the expression, $x_i(k)$ is a state of the attack elasticity controller of the i-th DG at the time point k; $x_i(k+1)$ is the state of the attack elasticity controller of the i-th DG at the time point k+1; $u_i(k)$ is the auxiliary control input of the attack elasticity controller of the i-th DG at the time point k; $\delta_1(x_i,u_i)$ is a bounded attack on an auxiliary control input actuator of the i-th DG; $\delta_2(x_i)$ is the bounded attack on an auxiliary control measurement device of the i-th DG; $w_i$ is the sum of the bounded attacks on the i-th DG; A, B, C and D are controller system matrices; $z_i(k)$ is a nominal system state of the attack elasticity controller of the i-th DG at the time point k; and $z_i(k+1)$ is a nominal system state of the attack elasticity controller of the i-th DG at the time point k+1.

The original system dynamics or the nominal model of the original system will be used for predicting the performance of the system within a period of time to optimize the auxiliary control input $u_i^*$;

For the distributed power generation unit with the above discrete dynamic equation, at every time point k, an OCP problem with a prediction visual field of N needs to be solved again every time, and this solving process is recorded as OCP 1.

OCP 1: using the sequence of optimal control $U_i^*(k)=\{u_i^*(k+0|k),u_i^*(k+1|k),\ldots,u_i^*(k+N-1|k)\}$ at the time point k for optimization: wherein, $s \in \mathbb{N}_{[0,N-1]}$;

$$\min_{U_i(t_k)} J_i(k); \quad (5)$$

$$J_i(k) = \frac{a_{ij}}{2} \sum_{j \in N_b i} \|y_i(k+N|k) - y_j(k+N|k)\|_F^2$$

wherein, $$+\frac{b_i}{2}\|y_i(k+N|k)-y_{ref}\|_{F_0}^2 + \frac{1}{2r_i}\sum_{s=0}^{N-1}\|u_i(k+s|k)\|_R^2,$$

$\|\cdot\|$ is an Euclidean norm, $\|\rho\|_F = \rho^T F \rho$; a clustering error weight matrix $F_0 \in \mathbb{R}^{m \times m}$, an output adjustment weight matrix $F_0 \in \mathbb{R}^{m \times m}$ and a control cost weight matrix $R \in \mathbb{R}^{p \times p}$ are all positive semidefinite matrices; a sequence of optimal control is predicted each time by using scrolling visual field cycles, but only the first item of the sequence of optimal control $u_i^*(k+0|k)=[I_{p \times p},0,\ldots,0]U_i^*(k)$ is applied each time; $J_i$ is a local optimization objective function of the i-th DG; S is any visual field range in the sequence, $S \in [1,N]$; $u_n^*(k+s|k)$ is any item in the visual field range in a sequence of optimal auxiliary control of the n-th DG at the time point k.

$$u_i^*(k+0) = -Ke_i(k+0) + K_{MPC}^{k+0}(e_i \otimes I)\left\{\begin{array}{l}a_{ij}\sum_{j \in N_b i}F[\hat{y}_i(k+N)-\hat{y}_j(k+N)]\\ +b_iF_0[y_i(\hat{k}+N|k)-y_{ref}]\end{array}\right\};$$

Figure 3:
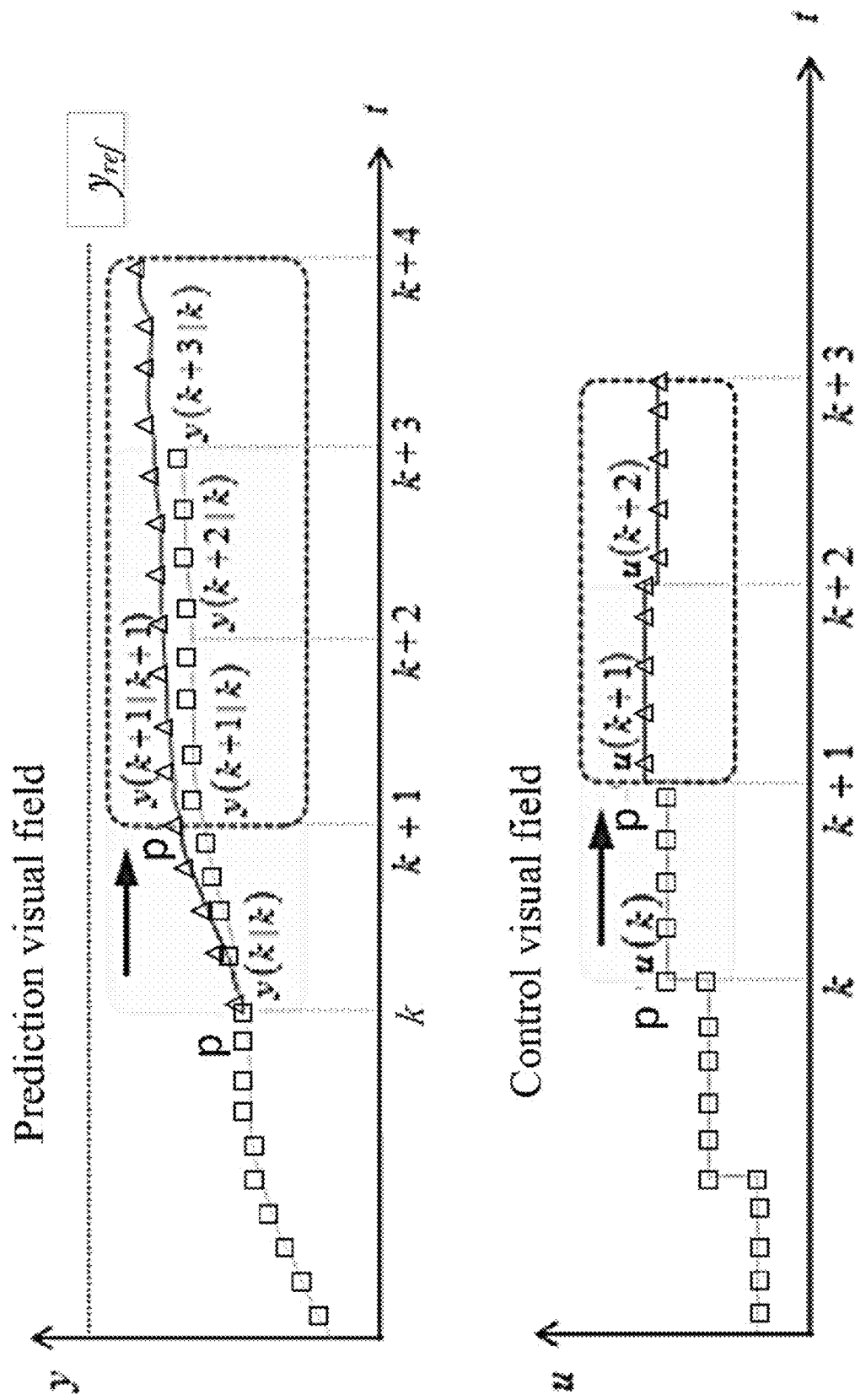
FIG. 3 is a schematic diagram for a scrolling visual field of a control strategy of the present invention.

At the time point k+1, the above open-loop strategy is reset (i.e., the OPC1 step is repeated), which means that the strategy is an implementation of the OCP problem according to the scrolling visual field scheme, as shown in FIG. 3. This actually provides an approximately closed-loop feedback mechanism, which enables the system to be more robust for uncertainty and respond to a malicious attack with a limited upper bound in a real-time manner.

Attack detection link: attack detection can be used as a front-end link of the above control strategy to detect an out-of-bounds malicious attack that cannot be passively defended by the attack elasticity controller.

The predicted sequence of optimal states x*(k+1|k), x*(k+2|k), ..., and x*(k+N|k) obtained at the time point k, is locally stored, and the current state sampling value x(k+1|k+1) is compared with the pre-stored x*(k+1|k) at the time point k+1 to obtain the solution of the mean square error (MSE): if MSE>ε, namely MSE exceeds a specific threshold value ε, the system is judged to be under an malicious attack. If a system attack is detected, active defense can be performed against the malicious attack. Namely, after the attack detection link detects such malicious attacks at the time point k+1, the sequence of optimal auxiliary control $u_i^*(k+1|k+1)$ calculated at the time point k+1 is abandoned without use and is replaced with the optimal auxiliary control input $u_i^*(k+1|k)$ at the time point k+1 predicted at the time point k. Similarly, if the attack detection link still detects such malicious attacks at the time point k+2, the sequence of optimal auxiliary control $u_i^*(k+2|k+2)$ calculated at the time point k+2 is abandoned without use and is replaced with the optimal auxiliary control input $u_i^*(k+2|k)$ at the time point k+2 predicted at the time point k, until the stop of the malicious attacks.

Then the frequency set point $\omega_i^*$ and the voltage set point $E_i^*$ required for the droop controller are calculated according to the optimal auxiliary control input $u_i^*$ of the local distributed attack elasticity controller.

wherein the optimal angular frequency reference value $\omega_i^*$ is input into the droop controller to complete the compensation for the controller frequency deviation:

$$\omega_i^* = \int u_i^* + D_{P,i} P_i \quad (7);$$

According to the specific expression of the droop controller:

$$\begin{cases} \omega_i = \omega_i^* - D_{P,i}(P_i - P_i^*) \\ E_i = E_i^* - D_{Q,i}(Q_i - Q_i^*) \end{cases} \quad (8)$$

it is accordingly available to obtain the reference voltage input $V_{oi}^*$ to the voltage controller and the angular frequency $\omega_i$ input into the voltage source inverter. The voltage controller obtains the reference current $I_{li}^*$ input into the current controller according to the reference voltage $V_{oi}^*$. The current controller obtains the reference voltage for controlling the PWM generator to generate the PWM signal according to the reference current $I_{li}^*$ and the output current of the voltage source inverter. The inverter output is further controlled according to the PWM signal and the angular frequency $\omega_i$ given by the droop controller.

The micro-grid comprises n distributed power generation units, and the global optimization of the entire micro-grid is achieved by using games to reach a Nash equilibrium point.

The Nash equilibrium game between distributed power generation units, namely the global function, is required to meet the following inequality:

$$J_i\left(\sum_{s=0}^{N-1} u_1^*(k+s|k), \ldots, \sum_{s=0}^{N-1} u_i^*(k+s|k), \ldots, \sum_{s=0}^{N-1} u_n^*(k+s|k)\right) \leq \quad (9)$$

-continued $$J_i\left(\sum_{s=0}^{N-1} u_1^*(k+s|k), \ldots, \sum_{s=0}^{N-1} u_i(k+s|k), \ldots, \sum_{s=0}^{N-1} u_n^*(k+s|k)\right);$$

wherein $u_j \in U(i=1, \ldots, n)$;

This means that n sequences of optimal auxiliary control $$\sum_{s=0}^{N-1} u_1^*(k+s|k), \sum_{s=0}^{N-1} u_i^*(k+s|k), \ldots, \sum_{s=0}^{N-1} u_n^*(k+s|k)$$

of distributed power generation units 1-n can reach the global Nash equilibrium point, that is, the auxiliary control inputs for n distributed power generation units in the entire micro-grid can jointly contribute to the global optimization of the micro-grid control system.

This system can achieve passive defense against bounded attacks on the local actuator and the measurement device of the distributed power supply in a fully distributed manner. The attack detection device as a front-end link can achieve the active defense of the system against more serious attacks. The calculation complexity of the control input is greatly simplified by terminal state observation, and the control strategy can be executed locally. Except for the estimated value required to be observed, all coefficients can be solved offline in advance. Therefore, this system can greatly reduce the calculation burden of the controller system during real-time processing. The system is enabled to achieve real-time defense against malicious attacks.

Each embodiment in the present specification is described in a progressive manner, each embodiment focuses on its differences from other embodiments, and the same and similar parts among the embodiments can be referred to each other.

The forgoing description of the disclosed embodiments enables those skilled in the art to be able to implement or use the present invention. Various modifications to these embodiments will be apparent to those skilled in the art, and the generic principles defined herein can be implemented in other embodiments without departing from the spirit or scope of the present invention. Therefore, the present invention is not to be limited to the embodiments shown herein but conforms to the widest scope consistent with the principles and novel features disclosed in this specification.

The invention claimed is:

1. A fully distributed island micro-grid attack elasticity control method, comprising the following steps:
   step 1: collecting basic information of a local alternating current (AC) micro-grid bus of a distributed power generation unit DG and basic information of a neighbor distributed power generation unit DG connected through a directed communication topology;
   step 2: predicting, based on a dynamic equation of the distributed power generation unit DG, a sequence of states of the distributed power generation unit DG within a set period of time, to obtain the predicted sequence of states, and storing the predicted sequence of states;
   step 3: judging whether a system is under attack according to a comparison result of a state value of the predicted sequence of states and a real-time state sampling value of a micro-grid, and obtaining a sequence of optimal auxiliary control inputs $u_i^*$ according to a judgment result;

step 4: using a first item of the sequence of optimal auxiliary control inputs $u_i^*$ as an auxiliary control input to calculate an optimal angular frequency reference value $\omega_i^*$ at a next time point; wherein an expression for obtaining the optimal angular frequency reference value $\omega_i^*$ according to the sequence of optimal auxiliary control inputs $u_i^*$ is:

$$\omega_i^* = \int u_i^* + D_{P,i} P_i$$

in the expression, $u_i^*$ is the sequence of optimal auxiliary control inputs of an i-th distributed power generation unit DG; $\omega_i^*$ is the optimal angular frequency reference value of the i-th distributed power generation unit DG at the next time point; $D_{P,i}$ is a droop control coefficient of the i-th distributed power generation unit DG; and $P_i$ is an output active power of the i-th distributed power generation unit DG; and step 5: inputting the optimal angular frequency reference value $\omega_i^*$ and an optimal potential reference value $E_i^*$ into a droop controller in a real-time manner to complete correction of a primary control of the droop controller.

2. The fully distributed island micro-grid attack elasticity control method according to claim 1, wherein the step of obtaining the predicted sequence of states comprises:
constructing a discrete-time dynamic equation of the distributed power generation unit DG considering attack elasticity;
constructing a nominal dynamic equation based on the discrete-time dynamic equation of the distributed power generation unit DG considering attack elasticity; and
predicting the sequence of states of the distributed power generation unit DG within the set period of time according to the nominal dynamic equation.

3. The fully distributed island micro-grid attack elasticity control method according to claim 2, wherein an expression of the discrete-time dynamic equation of the distributed power generation unit DG considering attack elasticity is:

$$x_i(k+1) = Ax_i(k) + B[u_i(k) + \delta_1(x_i(k), u_i(k))] + \delta_2(x_i(k));$$

$$Dw_i = B\delta_1 + \delta_2;$$

in the expression, $x_i(k)$ is a state of an attack elasticity controller of an i-th distributed power generation unit DG at a time point k; $x_i(k+1)$ is a state of the attack elasticity controller of the i-th distributed power generation unit DG at a time point k+1; $u_i(k)$ is an auxiliary control input of the attack elasticity controller of the i-th distributed power generation unit DG at the time point k; $\delta_1(x_i, u_i)$ is a bounded attack on an auxiliary control input actuator of the i-th distributed power generation unit DG; $\delta_2(x_i)$ is a bounded attack on an auxiliary control measurement device of the i-th distributed power generation unit DG; $w_i$ is a sum of bounded attacks on the i-th distributed power generation unit DG; and A, B and D are controller system matrices.

4. The fully distributed island micro-grid attack elasticity control method according to claim 2, wherein the nominal dynamic equation is defined as follows:

$$z_i(k+1) = Az_i(k) + Bv_i(k);$$

in the nominal dynamic equation, $z_i(k)$ is a nominal system state of an attack elasticity controller of an i-th distributed power generation unit DG at a time point k; $z_i(k+1)$ is a nominal system state of the attack elasticity controller of the i-th distributed power generation unit DG at a time point k+1; and A and B are both controller system matrices.

5. The fully distributed island micro-grid attack elasticity control method according to claim 2, wherein an expression for an error between an actual state value and a nominal state value is:

$$e_i(k) = x_i(k) - z_i(k);$$
$$\begin{aligned}e_i(k+1) &= x_i(k+1) - z_i(k+1) \\ &= Ae_i(k) - BKe_i(k) + Dw_i(k); \\ &= (A - BK)e_i(k) + Dw_i(k)\end{aligned}$$

in the expression, $x_i(k)$ is a state of an attack elasticity controller of an i-th distributed power generation unit DG at a time point k; $z_i(k)$ is a nominal system state of the attack elasticity controller of the i-th distributed power generation unit DG at the time point k; $x_i(k+1)$ is a state of the attack elasticity controller of the i-th distributed power generation unit DG at a time point k+1; $z_i(k+1)$ is a nominal system state of the attack elasticity controller of the i-th distributed power generation unit DG at the time point k+1; K is a system linear feedback gain of the attack elasticity controller of the i-th distributed power generation unit DG; $e_i(k)$ is an error between the real-time state sampling value and a nominal state value of the i-th distributed power generation unit DG at the time point k; $w_i$ is a sum of bounded attacks on the i-th distributed power generation unit DG; and A, B and D are all controller system matrices.

6. The fully distributed island micro-grid attack elasticity control method according to claim 1, wherein the first item of the sequence of optimal auxiliary control is configured as the auxiliary control input, the expression is as follows:

$$u_i^*(k+0) = -Ke_i(k+0) + K_{MPC}^{k+0}(e_i \otimes I) \left\{ \begin{array}{l} a_{ij} \sum_{j \in N_b^i} F\left[\hat{y}_i(k+N) - \hat{y}_j(k+N)\right] \\ + b_i F_0\left[y_i(\hat{k}+N|k) - y_{ref}\right] \end{array} \right\};$$

in the expression, $u_i^*(k+0)$ is the first item of the sequence of optimal auxiliary control; $e_i(k+0)$ is an error between the real-time state sampling value and a nominal state value of an i-th distributed power generation unit DG at a time point k; $a_{ij}$ is a communication topology connectivity coefficient between the i-th distributed power generation unit DG and a j-th distributed power generation unit DG; $b_i$ is a connectivity coefficient between the i-th distributed power generation unit DG and a leader node; $K_{MPC}^{k+0}$ is a local pre-calculated control coefficient; $\hat{y}_i(k+N)$ is an estimated value of a prediction visual field terminal input of an attack elasticity controller of the i-th distributed power generation unit DG at the time point k; $\hat{y}_j(k+N)$ is an estimated value of a prediction visual field terminal output of an attack elasticity controller of the j-th distributed power generation unit DG at the time point k; I is an identity matrix of an appropriate dimension; and $y_{ref}$ is an output reference value of a system leader node.

7. The fully distributed island micro-grid attack elasticity control method according to claim 1, wherein, in order to achieve global optimization of a micro-grid control system in a distributed manner, any local optimal function is required to meet the following constraint conditions:

$$J_i\left(\sum_{s=0}^{N-1} u_1^*(k+s|k), \ldots, \sum_{s=0}^{N-1} u_i^*(k+s|k), \ldots, \sum_{s=0}^{N-1} u_n^*(k+s|k)\right) \le$$

$$J_i\left(\sum_{s=0}^{N-1} u_1^*(k+s|k), \ldots, \sum_{s=0}^{N-1} u_j(k+s|k), \ldots, \sum_{s=0}^{N-1} u_n^*(k+s|k)\right) J_i(k) =$$

$$\frac{a_{ij}}{2} \sum_{j \in N_b i} \|y_i(k+N|k) - y_j(k+N|k)\|_F^2;$$

wherein $$+\frac{b_i}{2}\|y_i(k+N|k) - y_{ref}\|_{F_0}^2 + \frac{1}{2r_i}\sum_{s=0}^{N-1}\|u_i(k+s|k)\|_R^2;$$

in the expression, $\|\cdot\|$ is an Euclidean norm; F is a clustering error weight matrix; $F_0$ is an output adjustment weight matrix; R is a control cost weight matrix; $y_i(k+N|k)$ is a prediction visual field terminal output of an attack elasticity controller of an i-th distributed power generation unit DG at a time point k; $a_{ij}$ is a communication topology connectivity coefficient between the i-th distributed power generation unit DG and a j-th distributed power generation unit DG; $b_i$ is a connectivity coefficient between the i-th distributed power generation unit DG and a leader node; $y_j(k+N|k)$ is a prediction visual field terminal output of the attack elasticity controller of the j-th distributed power generation unit DG at the time point k; $r_i$ is an auxiliary control input coefficient of the j-th distributed power generation unit DG; $y_{ref}$ is an output reference value of a system leader node; $J_i$ is a local optimization objective function of the i-th distributed power generation unit DG; S is any visual field range in the sequence; $u_n^*(k+s|k)$ is any item of the sequence of optimal auxiliary control in a prediction visual field range of an n-th distributed power generation unit DG at the time point k.

8. The fully distributed island micro-grid attack elasticity control method according to claim 1, wherein the step of judging whether the system is under attack comprises:
   obtaining the real-time state sampling value at any time point;
   comparing the real-time state sampling value at any time point with the state value of the predicted sequence of states at corresponding time point to obtain a solution of a mean square error; and
   according to a comparison result of the mean square error and a set threshold value, judging whether the system is under attack: if the system is not under attack, using the optimal auxiliary control input calculated by the real-time state sampling value, and if the system is under attack, using the optimal auxiliary control input calculated by the state value of the predicted sequence of states at the corresponding time point.

9. A fully distributed island micro-grid attack elasticity control system consisting of an information layer structure and a physical layer, wherein a local control architecture of each distributed power generation unit DG comprises a communication network, a state collector, an attack elasticity controller, a power controller, a voltage controller, a current controller, and a voltage source inverter, wherein the communication network is configured for data transmission between distributed power supplies;
   the state collector is configured for collecting basic information of a local AC micro-grid bus and basic information of a neighbor distributed power generation unit DG connected through a directed communication topology;
   the attack elasticity controller is configured for judging whether each distributed power generation unit DG is under an out-of-bounds malicious attack, and calculating sequence of optimal auxiliary control inputs $u_i^*$ with attack elasticity, to obtain an optimal angular frequency reference value $\omega_i^*$ and an optimal potential reference value $E_i^*$; wherein an expression for obtaining the optimal angular frequency reference value $\omega_i^*$ according to the sequence of optimal auxiliary control inputs $u_i^*$ is:

$$\omega_i^* = \int u_i^* + D_{P,i} P_i$$

in the expression, $u_i^*$ is the sequence of optimal auxiliary control inputs of an i-th distributed power generation unit DG; $\omega_i^*$ is the optimal angular frequency reference value of the i-th distributed power generation unit DG at a next time point; $D_{P,i}$ is a droop control coefficient of the i-th distributed power generation unit DG; and $P_i$ is an output active power of the i-th distributed power generation unit DG;
   the power controller is configured for completing a compensation for a primary control frequency deviation of a droop controller in the power controller according to the optimal angular frequency reference value $\omega_i^*$ and the optimal potential reference value $E_i^*$;
   the voltage controller is configured for obtaining a reference current $I_{li}^*$ input into the current controller according to a reference voltage $V_{oi}^*$;
   the current controller is configured for obtaining a reference voltage for controlling a pulse-width modulation (PWM) generator to generate a PWM signal according to the reference current $I_{li}^*$ input into the current controller and an output voltage-current value of the voltage source inverter after dq decomposition; and
   the voltage source inverter is configured for outputting a voltage according to the PWM signal and an angular frequency $\omega_i$ of the power controller.

* * * * *